United States Patent
Kimura et al.

(10) Patent No.: US 8,206,602 B2
(45) Date of Patent: *Jun. 26, 2012

(54) METHOD OF MANUFACTURING MAGNETIC RECORDING MEDIUM

(75) Inventors: Kaori Kimura, Kawasaki (JP); Yousuke Isowaki, Yokohama (JP); Yoshiyuki Kamata, Tokyo (JP); Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

This patent is subject to a terminal disclaimer.

(21) Appl. No.: 12/838,349

(22) Filed: Jul. 16, 2010

(65) Prior Publication Data

US 2011/0014496 A1 Jan. 20, 2011

(30) Foreign Application Priority Data

Jul. 17, 2009 (JP) .................. 2009-169252

(51) Int. Cl.
*B44C 1/22* (2006.01)

(52) U.S. Cl. ............... 216/22; 216/40; 216/75; 438/736

(58) Field of Classification Search ............... 216/22, 216/40, 51, 67, 75; 438/736, 754, 714, 738
See application file for complete search history.

(56) References Cited

U.S. PATENT DOCUMENTS

| | | | |
|---|---|---|---|
| 5,925,501 A * | 7/1999 | Zhang et al. | 430/313 |
| 8,012,361 B2 * | 9/2011 | Kimura et al. | 216/22 |
| 2004/0253817 A1 * | 12/2004 | Imada et al. | 438/688 |
| 2005/0243467 A1 * | 11/2005 | Takai et al. | 360/135 |

FOREIGN PATENT DOCUMENTS

| | | |
|---|---|---|
| JP | 2005-050468 A | 2/2005 |
| JP | 2005-056547 A | 3/2005 |
| JP | 2005-099605 A | 4/2005 |
| JP | 2006-032655 | 2/2006 |
| JP | 2006-032655 A | 2/2006 |
| JP | 4128509 | 5/2008 |
| JP | 4191096 | 9/2008 |
| JP | 2009-026435 | 2/2009 |
| JP | 2009-026435 A | 2/2009 |
| JP | 2010-192070 A | 9/2010 |

OTHER PUBLICATIONS

Notification of Reasons for Rejection mailed by Japan Patent Office on Oct. 12, 2010 in the corresponding Japanese patent application No. 2009-169252.

* cited by examiner

*Primary Examiner* — Lan Vinh
(74) *Attorney, Agent, or Firm* — Knobbe, Martens Olson & Bear, LLP

(57) ABSTRACT

According to one embodiment, there is provided a method of manufacturing a magnetic recording medium, including forming a first hard mask including carbon as a main component, a second hard mask including a main component other than carbon and a resist on a magnetic recording layer, contacting a stamper to the resist to transfer patterns of protrusions and recesses to the resist, removing residues in the recesses of the patterned resist, etching the second hard mask, etching the first hard mask, patterning the magnetic recording layer, and removing the first hard mask, the method further including, between etching the first hard mask and removing the first hard mask, removing the second hard mask remaining on the protrusions of the first hard mask, and removing a contaminating layer on a surface of the first hard mask by a mixed gas of oxygen-based gas and a fluorine compound.

17 Claims, 5 Drawing Sheets

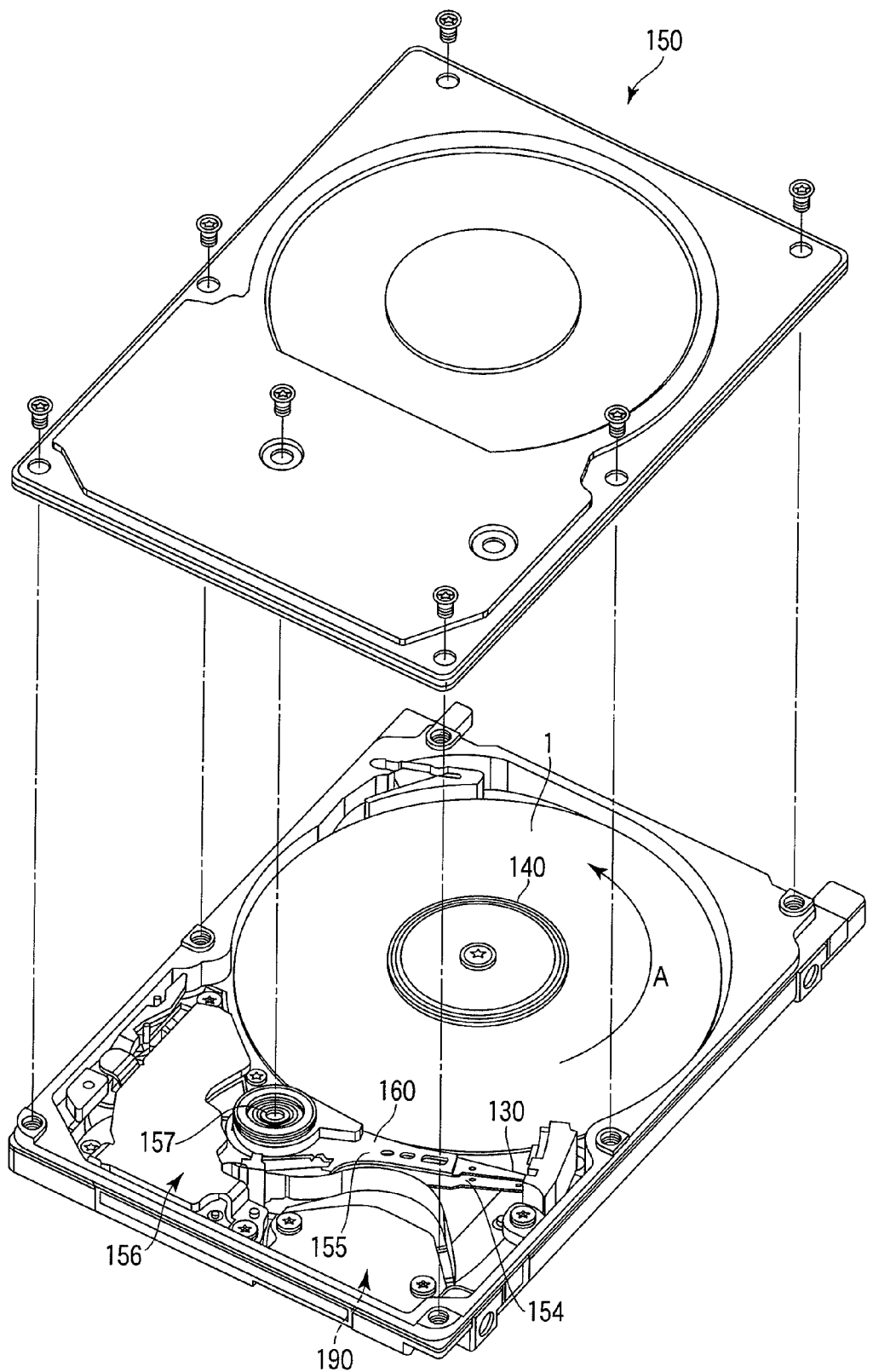
F I G. 6

METHOD OF MANUFACTURING MAGNETIC RECORDING MEDIUM

CROSS-REFERENCE TO RELATED APPLICATIONS

This application is based upon and claims the benefit of priority from Japanese Patent Application No. 2009-169252, filed Jul. 17, 2009; the entire contents of which are incorporated herein by reference.

FIELD

Embodiments described herein relate generally to a method of manufacturing a magnetic recording medium such as a patterned medium.

BACKGROUND

In the information-oriented society in recent years, the amount of data to be stored in a recording medium is continually increasing. For this reason, a recording apparatus and a recording medium with an outstandingly high recording capacity have been desired. Also, hard disks, which are currently in an increasing demand as an economical recording medium of high capacity, are expected to be required to have recording density of one terabit or more per square inch, which is ten times the current density, in coming years.

In a magnetic recording medium used in conventional hard disks, a predetermined region of a thin film including polycrystals of magnetic fine particles is used as one bit for recording. In order to increase recording capacity of a magnetic recording medium, the recording density should be increased. In other words, it is necessary to reduce the recording mark size which is usable for recording of one bit. However, when the recording mark size is simply reduced, the influence of noise which depends on the shapes of magnetic fine particles becomes nonnegligible. If the particle size of magnetic fine particles is reduced to lower the noise, a problem of thermal fluctuation occurs, which makes it impossible to maintain recorded data at a room temperature.

In order to avoid these problems, a bit-patterned medium (BPM) has been proposed, in which the recording material is separated by a nonmagnetic material in advance, and a single magnetic dot is used as a single recording cell to perform read and write.

In magnetic recording media installed in HDDs, there is an arising problem of the interference between adjacent tracks which inhibits improvement in track density. Particularly, reducing a fringe effect of a write head field is a significant technical problem to be solved. To solve this problem, there has been developed a discrete track recording-type patterned medium (DTR medium), in which the magnetic recording layer is processed so that the recording tracks are physically separated from each other. In the DTR medium, it is possible to reduce side erase which erases information in the adjacent tracks in writing and side read which reads information in the adjacent tracks in reading. On this account, the DTR medium is promising as a magnetic recording medium capable of providing a high recording density. Incidentally, it should be noted that the term "patterned medium" as used herein in a broad sense includes the bit-patterned medium and DTR medium.

In the manufacture of a patterned medium (DTR medium or BPM), it is an extremely significant problem to reduce irregularity on the surface of the medium, from the viewpoint of flying property of the head. In an ordinary patterned medium, magnetism is separated by using a method such as etching to physically separate the magnetic recording layer. However, if a magnetic recording layer having a thickness of several tens of nanometers is completely etched, the flying property of the head is deteriorated, and as a result, the HDD does not properly function. To overcome this problem, a method of filling recesses is well known. Also effective is a method of deactivating recessed regions as we suggest. In this method, regions of the magnetic recording layer corresponding to the non-recording regions in a patterned medium are deactivated to lose the magnetism thereof, and as a result, a separating effect can be obtained without physically separating the magnetic recording layer.

Japanese Patent No. 4191096 discloses a method of manufacturing a magnetic recording medium including cleaning a magnetic recording layer by means of non-oxide-type gas which contains hydrogen after the removal of a mask in order to prevent the magnetic recording layer from deterioration or corrosion caused by etching which uses an oxidizing gas. In this method, the cleaning step is introduced only for focusing on the affect caused by the reaction between a magnetic recording layer and an etching gas, while the affects between mask layers or between a mask layer and an etching gas are not taken into consideration.

Japanese Patent No. 4128509 discloses a method of manufacturing a magnetic recording medium which uses two mask layers. The patent discloses that a combination of a mask layer including Si and a mask layer including C may be selected as the two mask layers. However, there is no disclosure of the problem caused by such a combination nor countermeasure therefor. Particularly, steps of cleaning or removing unnecessary components as disclosed in Japanese Patent No. 4191096 are not disclosed in Japanese Patent No. 4128509.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 6 is a perspective view of a magnetic recording apparatus in which a magnetic recording medium manufactured by the embodiment is installed.

DETAILED DESCRIPTION

Various embodiments will be described hereinafter with reference to the accompanying drawings.

In general, according to one embodiment, there is provided a method of manufacturing a magnetic recording medium comprising forming a first hard mask comprising carbon as a main component, a second hard mask comprising a main component other than carbon and a resist on a magnetic recording layer, contacting a stamper to the resist to transfer patterns of protrusions and recesses to the resist, removing residues in the recesses of the patterned resist, etching the second hard mask by using the patterned resist as a mask to transfer the patterns of protrusions and recesses to the second hard mask, etching the first hard mask by using the second hard mask as a mask to transfer the patterns of protrusions and recesses to the first hard mask, patterning the magnetic recording layer, and removing the first hard mask, the method further comprising, between etching the first hard mask to transfer the patterns of protrusions and recesses to the first hard mask and removing the first hard mask, removing the second hard mask remaining on the protrusions of the first hard mask, and removing a contaminating layer on the surface of the mask by means of a mixed gas of oxygen-based gas and a fluorine compound.

Figure 1:
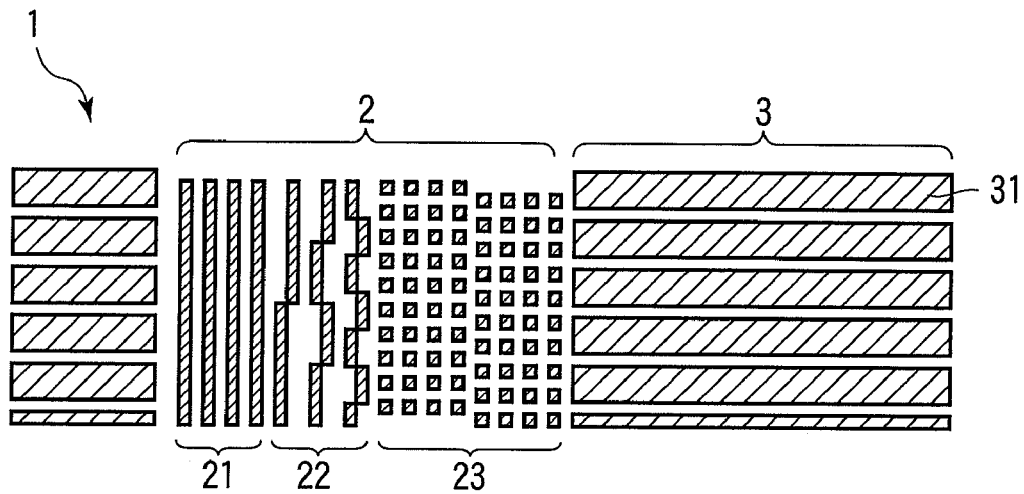
FIG. 1 is a plane view of a discrete track recording (DTR) medium manufactured by the method of an embodiment along the circumferential direction.

FIG. 1 shows a plane view of a discrete track recording (DTR) medium which is an example of the patterned medium manufactured by the method of the embodiment along the circumferential direction. As shown in FIG. 1, servo regions 2 and data regions 3 are alternately formed along the circumferential direction of a patterned medium 1. The servo region 2 includes a preamble section 21, an address section 22 and a burst section 23. The data region 3 includes discrete tracks 31 wherein adjacent tracks are separated from each other.

Figure 2:
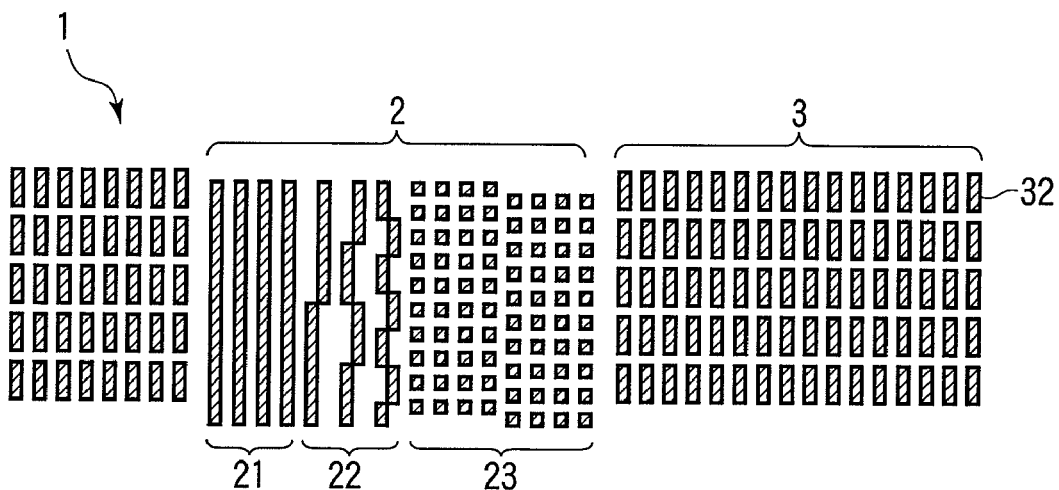
FIG. 2 is a plane view of a bit-patterned medium manufactured by the method of an embodiment along the circumferential direction.

FIG. 2 shows a plane view of a bit-patterned medium (BPM) which is another example of the patterned medium manufactured by the method of the embodiment along the circumferential direction. In this patterned medium, magnetic dots 32 are formed in the data region 3.

An example of the method of manufacturing a magnetic recording medium according to the embodiment is explained hereinafter with reference to FIGS. 3A to 3J.

Figure 3A:
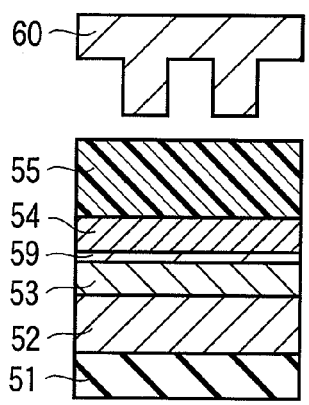
FIG. 3A, FIG. 3B, FIG. 3C, FIG. 3D, FIG. 3E, FIG. 3F, FIG. 3G, FIG. 3H, FIGS. 3I and 3J are sectional views showing an example of a method of manufacturing a magnetic recording medium according to an embodiment.

As shown in FIG. 3A, on a glass substrate 51, a soft magnetic layer (CoZrNb) with a thickness of 40 nm (not shown), an underlayer (Ru) for orientation control with a thickness of 20 nm (not shown) and a magnetic recording layer 52 (CoCrPt-SiO$_2$) with a thickness of 20 nm are deposited. On the magnetic recording layer 52, a first hard mask 53 made of carbon with a thickness of 25 nm and a second hard mask 54 made of Si with a thickness of 3 nm are deposited. A resist 55 is spin-coated on the second hard mask 54 to provide a thickness of 50 nm. On the other hand, a stamper 60 on which predetermined patterns of protrusions and recesses corresponding to the patterns shown in FIG. 1 or 2, for example, are formed is prepared. The stamper 60 is manufactured through processes of electron beam lithography, Nickel electroforming and injection molding. The stamper 60 is disposed so that the surface having the protrusions and recesses faces the resist 55.

Figure 3F:
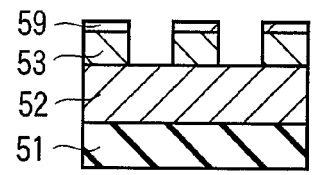
Figure 3B:
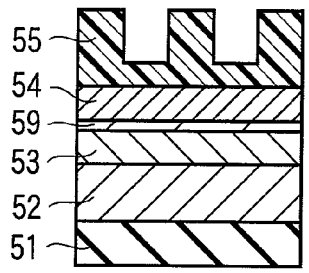

As shown in FIG. 3B, the resist 55 is imprinted with the stamper 60 to transfer the patterns of protrusions and recesses of the stamper 60 to the resist 55. After that, the stamper 60 is removed. Resist residues are left in the bottoms of the recesses of the patterns of protrusions and recesses transferred to the resist 55.

Figure 3G:
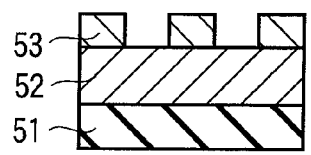
Figure 3C:
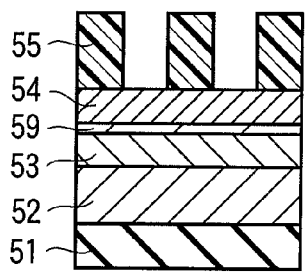

As shown in FIG. 3C, the resist residues in the recesses are removed by dry etching so that the surface of the second hard mask 54 is exposed. This step is performed, for example, by means of an ICP-RIE system, using CF$_4$ as a process gas, with a chamber pressure set to 0.1 Pa, an RF power of a coil and an RF power of a platen set to 100 W and 50 W, respectively, and an etching time set to 60 seconds.

Figure 3H:
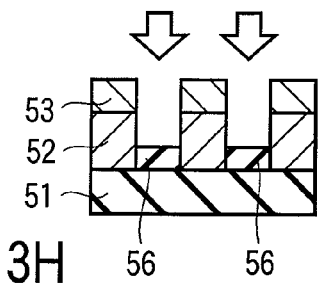
Figure 3D:
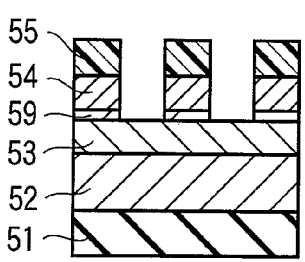

As shown in FIG. 3D, the patterns are transferred to the second hard mask 54 by using the patterned resist 55 as a mask, by means of ion beam etching so that the first hard mask 53 is exposed at the recesses. This step is performed, for example, by means of an inductively coupled plasma (ICP) RIE system, using CF$_4$ as a process gas, with a chamber pressure set to 0.1 Pa, an RF power of a coil and an RF power of a platen set to 100 W and 50 W, respectively, and an etching time set to 10 seconds. Incidentally, the steps of FIGS. 3C and 3D can be performed at a time.

Figure 3I:
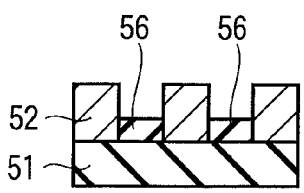
Figure 3E:
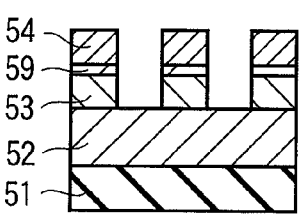

As shown in FIG. 3E, using the patterned second hard mask 54 as a mask, the first hard mask 53 made of carbon is etched to transfer the patterns so that the surface of the magnetic recording layer 52 is exposed at the recesses. This step is performed, for example, by means of an RIE system, using gaseous O$_2$, with a gas pressure set to 0.1 Pa, an RF power of a coil and an RF power of a platen set to 100 W and 50 W, respectively, and an etching time set to 30 seconds. At this time, the remaining resist 55 is also stripped off.

As shown in FIG. 3F, the remaining second hard mask (Si) 54 is removed. This step is performed, for example, by means of an RIE system, using CF$_4$ as a process gas, with a chamber pressure set to 1.5 Pa, an RF power of a coil and an RF power of a platen set to 200 W and 0 W, respectively, and an etching time set to 60 seconds, to thereby remove the remaining second hard mask 54 entirely.

As shown in FIG. 3G, a contaminating layer 59 produced on the surface of the first hard mask 53 is removed. This step is performed, for example, by means of an RIE system, using a mixed gas of CF$_4$ and O$_2$ at a flow ratio of 1:15, with a gas pressure of 1.5 Pa, an RF power of a coil and an RF power of a platen set to 400 W and 0 W, respectively, and an etching time set to 15 seconds.

As shown in FIG. 3H, a patterning of the magnetic recording layer is performed. In the examples shown in FIGS. 3A to 3J, a non-magnetic layer 56 is formed by deactivating the magnetic recording layer 52 at the recessed regions of the patterns. In this case, by means of a deactivating gas, crystals of the magnetic recording layer 52 are changed to amorphous phase to thereby deactivate the magnetism. This step is performed, for example, by means of an ECR ion gun, using a mixed gas of He and N$_2$ at a flow ratio of 1:1, with a gas pressure of 0.02 Pa, a microwave power of 1000 W, an acceleration voltage of 1000 V and processing time of 200 seconds.

As shown in FIG. 3I, the remaining first hard mask (carbon) 53 is removed. This step is performed, for example, by means of an RIE system, using gaseous O$_2$, with a gas pressure set to 1.5 Pa, an RF power of a coil and an RF power of a platen set to 400 W and 0 W, respectively, and an etching time set to 30 seconds.

Figure 3J:
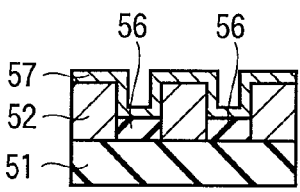

As shown in FIG. 3J, a protective film 57 is formed by chemical vapor deposition (CVD), and a lubricant is applied thereto to provide a patterned medium of the embodiment.

In this connection, the method of manufacture in the embodiment is not limited to the one shown in FIG. 3, but may be a method wherein the order of FIGS. 3F to 3H is changed. For example, the method may be the ones as shown in FIGS. 4A to 4J or FIGS. 5A to 5J which will be explained below in detail. Any of the methods including the ones shown in FIGS. 3A to 3J to FIGS. 5A to 5J can produce a magnetic recording medium with a controlled surface roughness.

Figure 4A:
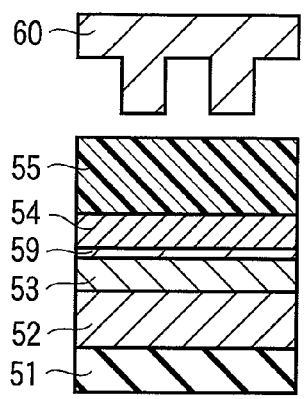
FIG. 4A, FIG. 4B, FIG. 4C, FIG. 4D, FIG. 4E, FIG. 4F, FIG. 4G, FIG. 4H, FIGS. 4I and 4J are sectional views showing another example of a method of manufacturing a magnetic recording medium according to an embodiment.
Figure 4F:
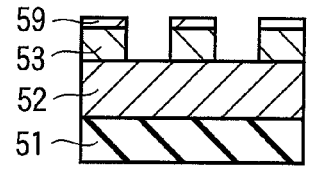
Figure 4B:
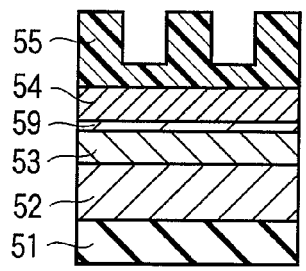

Specifically, in the method shown in FIGS. 3A to 3J, the second hard mask 54 remaining on the protrusions of the first hard mask 53 is removed (FIG. 3F), then the contaminating layer 59 on the surface of the mask is removed by means of a mixed gas of oxygen-based gas and a fluorine compound (FIG. 3G), and thereafter, the patterning of the magnetic recording layer 52 (FIG. 3H) is performed. In the method shown in FIGS. 4A to 4J, the second hard mask 54 remaining on the protrusions of the first hard mask 53 is removed (FIG. 4F), then the patterning of the magnetic recording layer 52 (FIG. 4G) is performed, and thereafter, the contaminating layer 59 on the surface of the mask is removed by using a mixed gas of oxygen-based gas and a fluorine compound (FIG. 4H). In the methods shown in FIGS. 5A to 5J, the patterning of the magnetic recording layer 52 is performed first (FIG. 5F), and then the second hard mask 54 remaining on the protrusions of the first hard mask 53 is removed (FIG. 5G), and thereafter, the contaminating layer 59 on the surface of the mask is removed by using a mixed gas of oxygen-based gas and a fluorine compound (FIG. 5H).

Incidentally, in the above processes, the thickness of various types of films and the depth of the recesses can easily be measured using, for example, an atomic force microscope (AFM), cross-sectional transmission electron microscope (TEM) or the like. Also, the type of metal mask and its composition ratio can easily be determined by energy dispersive X-ray spectroscopy (EDX) analysis. It is also possible to investigate the type of etching gas used in the ion beam etching and its effect by subjecting the finished medium to X-ray photoelectron spectroscopy (XPS) analysis to analyze the remaining gas within the medium.

Hereinafter, the embodiments of the present invention will be described in detail.

<First Hard Mask>

The first hard mask in the method of the embodiment comprises carbon as the main component. The proportion of carbon is desirably more than 75% in terms of atom number ratio. When the proportion of carbon is 75% or less, the etching selectivity is decreased, which results in a tendency that a magnetic layer cannot be processed into a good shape. The first hard mask can be deposited by means of sputtering or CVD. The thickness of the first hard mask is preferably 4 to 50 nm. If the mask is too thick, it takes a long time for etching when the mask is stripped off, which will cause damage to the side of a patterned layer. If the mask is too thin, it cannot function as a hard mask at the time of etching. If necessary, an antioxidant layer may be deposited between the first hard mask and the magnetic recording layer.

<Second Hard Mask>

The second hard mask 54 in the method of the embodiment may desirably be one having resistance to gaseous $O_2$ or $O_3$ and including, as a main component, Ag, Au, Co, Cr, Cu, Ni, Pd, Pt or Ru; or Si, $SiO_2$, SixNy (wherein x:y=1:1 to 3:4), SiON, Al, Ta or Ti. Also, these elements can be used as a simple substance; or nitride, oxide, alloy and a mixture of these elements can be used. The thickness of the second hard mask 54 is preferably 1 to 15 nm, and particularly preferably 2 to 5 nm. If the mask is too thick, it causes damage to the magnetic recording layer at the time of removal of the second hard mask 54. To the contrary, if the mask is too thin, it cannot be deposited uniformly.

<Removal of Contaminating Layer>

Hereinafter the step of FIG. 3G will be described in detail. In the method of the embodiment, the contaminating layer 59 which has been produced between the second hard mask 54 and the first hard mask 53 is removed by using a mixed gas of a fluorine compound and an oxygen-based gas. The contaminating layer 59 is derived from a mixing due to the sputtering process. When the second hard mask 54 is directly deposited on the first hard mask 53 which comprises C as a main component, a mixing layer will be produced in the interface therebetween.

In the conventional methods, since even the presence of such a contaminating layer caused by the mixing was not recognized, there was no independent step to remove the contaminating layer 59. That is, the contaminating layer 59 was partially removed simultaneously with the removal of the second hard mask 54 or the first hard mask 53, or simultaneously with the processing or the deactivating step of the magnetic material. In such a method, even after the removal of the hard mask, solely the contaminating layer 59 is not removed and remains as projections on the surface of the recording layer. As a result, smoothness of the surface of the obtained magnetic recording medium is deteriorated and flying stability of a head will be decreased.

The method of the embodiment comprises performing the removal of the contaminating layer 59 independently of the removal of the second hard mask 54. The method further comprises the use of a mixed gas of a fluorine compound and an oxygen-based gas (for example, $CF_4$ and $O_2$ may be used) in the step of removal of the contaminating layer 59. Since the contaminating layer 59 results from the mixing of the second hard mask 54 and the first hard mask 53 comprising C as a main component, the contaminating layer has a high resistance against physical etching. In this regard, use of chemical etching is desirable to remove the contaminating layer 59. However, when gaseous $CF_4$ is used alone for the chemical etching, re-deposition will be produced and the removal thereof will be impossible. To prevent the re-deposition, $O_2$ is mixed with the etching gas. An additional reason for independently removing the contaminating layer 59 is that a mixed gas of $CF_4$ and $O_2$, if used in the removal of the second hard mask 54, will deteriorate the shape of the mask. It is possible to remove the second hard mask 54 by means of a mixed gas of $CF_4$ and $O_2$; however, if the mixed gas is used in the removal, $O_2$ contained therein will also etch the first hard mask 53 at the same time. This results in a problem that the width of the mask is reduced and a track width sufficient for a magnetic recording medium cannot be secured. According to the method of the embodiment, the second hard mask 54 is sufficiently removed by means of a gas which does not contain $O_2$, and thereafter, the contaminating layer 59 is removed in an independent step. Therefore, in the method, the etching time necessary to remove the contaminating layer 59 is extremely short, and it is possible to minimize the deterioration of the shape of the mask. This step of removing the contaminating layer 59 may be performed at any stage after etching the first hard mask 53 to transfer the patterns of protrusions and recesses and before the removal of the first hard mask 53.

In the removal of the contaminating layer 59, a mixed gas of a fluorine compound such as $CF_4$ $C_2F_6$, $C_3F_8$, $C_4F_8$, $SF_6$, $NF_3$, $CHF_3$ or HF and an oxygen-based gas such as oxygen or ozone is used. At this time, an inductively coupled plasma (ICP) RIE system can be used. The mixing ratio of the fluorine compound to the oxygen-based gas may be arbitrarily set. However, it is preferably set to 0.5% or more and 90% or less in terms of partial pressure of the gaseous fluorine compound. This is to sufficiently obtain the effect of the gaseous fluorine compound by the setting of 0.5% or more, and to efficiently suppress the generation of the re-deposition by the setting of 90% or less.

<Patterning of the Magnetic Recording Layer>

The patterning step of the magnetic recording layer included in the present method of manufacturing may be performed, for example, by deactivation using a reactive gas.

By deactivating the recessed regions of the magnetic recording layer 52, the magnetic recording medium is improved in fringe property. As used herein, a step of deactivating magnetism refers to a step of weakening the magnetism of the regions exposed from the mask in comparison with the magnetism of the regions covered with the mask in the magnetic recording layer 52. Weakening the magnetism refers to changing the magnetism to soft magnetic, nonmagnetic or diamagnetic. These changes in the magnetism can be observed by measuring the values of Hn, Hs, Hc, etc., by means of a vibrating sample magnetometer (VSM) or Kerr (magnetooptic effect) measurement system.

In the method of the embodiment, the step of deactivation of the magnetism may be performed by means of a gas or a solution. As a gas used in the method, $H_2$, $O_2$, $O_3$, $N_2$, $CF_4$, $C_2F_6$, $C_3F_8$, $C_4F_8$, $SF_6$, $NF_3$, $CHF_3$, HF, CO, $NH_3$, $Cl_2$, He, Ar, Ne, Kr, Xe, or a mixture thereof may be used. In the case of using a gaseous fluorine compound, a step of removing reactant product of fluorine and Co contained in the magnetic recording layer 52 may be added. This step is preferably performed by means of water washing, irradiation with water plasma or $H_2$ plasma, or the like. In a case where a noble gas such as He, Ne, Ar, Kr or Xe is used, the gas is ionized by means of ECR and the like, and emitted with high acceleration energy to thereby destroy the crystal structure in the magnetic recording layer where the magnetism is lost. In a case where $O_2$ or $N_2$ is used, O or N atoms are incorporated into the crystal structure to form a compound. It is also possible to use a combination of noble gas such as He or Ar and a reactive gas of $N_2$ or $O_2$, which is very desirable for deactivating the magnetism, for having the effects of the both kinds of gas. It is particularly preferable to use a mixed gas of He and $N_2$. In a case where gaseous $N_2$ or $O_2$ is used, it is preferable to deposit the first hard mask thicker, since the first hard mask is simultaneously etched. In a case where the step of deactivation of the magnetism is performed by means of a solution, that is, using a wet-etching method, an acid such as hydrofluoric acid, hydrochloric acid, nitric acid, and sulfamic acid is used.

In addition, it is also possible to provide a step where a part of the magnetic recording layer 52 is etched by using the first hard mask 53 as a mask, prior to the step of deactivation of the magnetism. This step may be performed by means of etching which uses noble gas of He, Ar, Ne, Kr or Xe; or $O_2$, $N_2$, $Cl_2$, $CF_4$, $NH_3$ or CO. For example, this step is preferably performed by means of etching which uses an ion beam of He, Ne, Ar, Kr, Xe and the like (especially, Ar gas is preferably used). Also the step is preferably performed by means of an ion beam irradiation carried out by electron cyclotron resonance (ECR) which uses gaseous Ar (or $O_2$ or $N_2$). It is also possible to use RIE which uses a gaseous Cl compound or a mixed gas of CO and $NH_3$ or methanol. The depth of processing is made shallow in the direction of thickness of the magnetic recording layer to leave a part of the magnetic recording layer. For example, the magnetic recording layer may be etched to the depth of 15 nm or less to provide a difference from the protrusions (recording regions). "Recording regions" as used herein refer to the regions which were masked by the first hard mask during the step of deactivation of the magnetism and, as a result, the magnetization thereof has not been lost. By providing such a step of etching the magnetic recording layer 52, it is possible to shorten the time of the subsequent process of deactivating the magnetism.

The patterning of the magnetic recording layer included in the present manufacturing method can be performed only by removing particular regions in the magnetic recording layer completely, without the above-mentioned deactivation of the magnetism. For example, using the first hard mask 53 as a mask, the magnetic recording layer 52 may be etched with respect to the regions exposed from the mask, until the underlying layer was exposed to thereby separate the magnetic recording layer 52. This step may be performed by means of etching which uses a noble gas of He, Ar, Ne, Kr or Xe; or $O_2$, $N_2$, $Cl_2$, $CF_4$, $NH_3$, or CO. For example, this step is preferably performed by means of etching which uses an ion beam of He, Ne, Ar, Kr, Xe and the like (especially, gaseous Ar is preferably used). The step is also preferably performed by means of ion beam irradiation carried out by electron cyclotron resonance (ECR) which uses gaseous Ar (or $O_2$ or $N_2$). It is also possible to use RIE which uses a gaseous Cl compound, a mixed gas of CO and $NH_3$, or methanol.

<Step of Reduction of the Magnetic Recording Layer>

In the method of manufacture of the embodiment, a reduction step may be optionally performed after the removal of the first hard mask 53 and prior to the formation of the protective film 57. The reduction step will overcome the problem of oxidative damage to the magnetic recording layer 52 which has been caused by oxygen used in the removal of the first hard mask 53, and will improve the magnetism of the finally produced magnetic recording medium. The reduction step may be performed by means of an irradiation which uses an ion beam generated by an ECR or RF power source; or by means of an RIE system. As a reducing gas, $H_2$, $NH_3$ or CO may be used alone, or with a small amount of noble gas of He, Ne, Ar, Xe and the like mixed thereto for the purpose of cleaning the surface.

Hereinafter, preferable materials to be used in the embodiments other than the materials described above will be described.

<Substrate>

As the substrate, for example, a glass substrate, an Al-based alloy substrate, a ceramic substrate, a carbon substrate or an Si single crystal substrate having an oxide surface may be used. As the glass substrate, an amorphous glass and a crystallized glass are used. Examples of the amorphous glass may include a general-purpose soda lime glass and an alumino-silicate glass. As the crystallized glass, a lithium-based crystallized glass may be exemplified. Examples of the ceramic substrate may include a sintered material containing, as a major component, a general-purpose aluminum oxide, an aluminum nitride, silicon nitride or the like, and fiber-reinforced materials thereof. As the substrate, it is also possible to use the above-described metal substrates or nonmetal substrates with a NiP layer formed thereon by plating or sputtering. Additionally, the methods of forming a thin film on the substrate are not limited to sputtering, but may include vacuum evaporation or electrolytic plating which can obtain the same effect.

<Soft Magnetic Underlayer>

The soft magnetic underlayer (SUL) serves a part of such a function of a magnetic head as to pass a recording magnetic field from a single-pole head for magnetizing a perpendicular magnetic recording layer in a horizontal direction and to circulate the magnetic field to the side of the magnetic head, and applies a sharp and sufficient perpendicular magnetic field to the recording layer, thereby improving read/write efficiency. For the soft magnetic underlayer, a material containing Fe, Ni or Co may be used. Examples of such a material may include FeCo-based alloys such as FeCo and FeCoV, FeNi-based alloys such as FeNi, FeNiMo, FeNiCr and FeNiSi, FeAl-based alloys and FeSi-based alloys such as FeAl, FeAlSi, FeAlSiCr, FeAlSiTiRu and FeAlO, FeTa-based alloys such as FeTa, FeTaC and FeTaN and FeZr-based alloys such as FeZrN. Materials having a microcrystalline structure such as FeAlO, FeMgO, FeTaN and FeZrN containing Fe in an amount of 60 at % or more or a granular structure in which fine crystal grains are dispersed in a matrix may also be used. As other materials to be used for the soft magnetic underlayer, Co alloys containing Co and at least one of Zr, Hf, Nb, Ta, Ti and Y may also be used. Such a Co alloy preferably contains 80 at % or more of Co. In the case of such a Co alloy, an amorphous layer is easily formed when it is deposited by sputtering. Because the amorphous soft magnetic material is not provided with crystalline anisotropy, crystal defects and grain boundaries, it exhibits excellent soft magnetism and is capable of reducing medium noise. Preferable examples of the amorphous soft magnetic material may include CoZr-, CoZrNb- and CoZrTa-based alloys.

An underlayer may further be formed beneath the soft magnetic underlayer to improve the crystallinity of the soft magnetic underlayer or to improve the adhesion of the soft magnetic underlayer to the substrate. As the material of such an underlayer, Ti, Ta, W, Cr, Pt, alloys containing these metals or oxides or nitrides of these metals may be used. An intermediate layer made of a nonmagnetic material may be formed between the soft magnetic underlayer and the recording layer. The intermediate layer has two functions including the function to cut the exchange coupling interaction between the soft magnetic underlayer and the recording layer and the function to control the crystallinity of the recording layer. As the material for the intermediate layer Ru, Pt, Pd, W, Ti, Ta, Cr, Si, alloys containing these metals or oxides or nitrides of these metals may be used.

In order to prevent spike noise, the soft magnetic underlayer may be divided into plural layers and Ru layers with a thickness of 0.5 to 1.5 nm are interposed therebetween to attain anti-ferromagnetic coupling. Also, a soft magnetic layer may be exchange-coupled with a pinning layer of a hard magnetic film such as CoCrPt, SmCo or FePt having longitudinal anisotropy or an anti-ferromagnetic film such as IrMn and PtMn. A magnetic film (such as Co) and a nonmagnetic film (such as Pt) may be provided under and on the Ru layer to control exchange coupling force.

<Magnetic Recording Layer>

For the perpendicular magnetic recording layer, a material containing Co as a main component, at least Pt and further an oxide is preferably used. The perpendicular magnetic recording layer may contain Cr if needed. As the oxide, silicon oxide or titanium oxide is particularly preferable. The perpendicular magnetic recording layer preferably has a structure in which magnetic grains, i.e., crystal grains having magnetism, are dispersed in the layer. The magnetic grains preferably have a columnar structure which penetrates the perpendicular magnetic recording layer in the thickness direction. The formation of such a structure improves the orientation and crystallinity of the magnetic grains of the perpendicular magnetic recording layer, with the result that a signal-to-noise ratio (SNR) suitable to high-density recording can be provided. The amount of the oxide to be contained is important to provide such a structure.

The content of the oxide in the perpendicular magnetic recording layer is preferably 3 mol % or more and 12 mol % or less and more preferably 5 mol % or more and 10 mol % or less based on the total amount of Co, Cr and Pt. The reason why the content of the oxide in the perpendicular magnetic recording layer is preferably in the above range is that, when the perpendicular magnetic recording layer is formed, the oxide precipitates around the magnetic grains, and can separate fine magnetic grains. If the oxide content exceeds the above range, the oxide remains in the magnetic grains and damages the orientation and crystallinity of the magnetic grains. Moreover, the oxide precipitates on the upper and lower parts of the magnetic grains, with an undesirable result that the columnar structure, in which the magnetic grains penetrate the perpendicular magnetic recording layer in the thickness direction, is not formed. The oxide content less than the above range is undesirable because the fine magnetic grains are insufficiently separated, resulting in increased noise when information is reproduced, and therefore, a signal-to-noise ratio (SNR) suitable to high-density recording is not provided.

The content of Cr in the perpendicular magnetic recording layer is preferably 0 at % or more and 16 at % or less and more preferably 10 at % or more and 14 at % or less. The reason why the content of the Cr is preferably in the above range is that the uniaxial crystal magnetic anisotropic constant Ku of the magnetic grains is not too much reduced and high magnetization is retained, with the result that read/write characteristics suitable to high-density recording and sufficient thermal fluctuation characteristics are provided. The Cr content exceeding the above range is undesirable because Ku of the magnetic grains is lowered, and therefore, the thermal fluctuation characteristics are degraded, and also, the crystallinity and orientation of the magnetic grains are impaired, resulting in deterioration in read/write characteristics.

The content of Pt in the perpendicular magnetic recording layer is preferably 10 at % or more and 25 at % or less. The reason why the content of Pt is preferably in the above range is that the Ku value required for the perpendicular magnetic layer is provided, and further, the crystallinity and orientation of the magnetic grains are improved, with the result that the thermal fluctuation characteristics and read/write characteristics suitable to high-density recording are provided. The Pt content exceeding the above range is undesirable because a layer having an fcc structure is formed in the magnetic grains and there is a risk that the crystallinity and orientation are impaired. The Pt content less than the above range is undesirable because a Ku value satisfactory for the thermal fluctuation characteristics suitable to high-density recording is not provided.

The perpendicular magnetic recording layer may contain one or more types of elements selected from B, Ta, Mo, Cu, Nd, W, Nb, Sm, Tb, Ru and Re besides Co, Cr, Pt and the oxides. When the above elements are contained, formation of fine magnetic grains is promoted or the crystallinity and orientation can be improved and read/write characteristics and thermal fluctuation characteristics suitable to high-density recording can be provided. The total content of the above elements is preferably 8 at % or less. The content exceeding 8 at % is undesirable because phases other than the hcp phase are formed in the magnetic grains and the crystallinity and orientation of the magnetic grains are disturbed, with the result that read/write characteristics and thermal fluctuation characteristics suitable to high-density recording are not provided.

As the perpendicular magnetic recording layer, a CoPt-based alloy, CoCr-based alloy, CoPtCr-based alloy, CoPtO, CoPtCrO, CoPtSi, CoPtCrSi, a multilayer structure of an alloy layer containing at least one type selected from the group consisting of Pt, Pd, Rh and Ru and a Co layer, and materials obtained by adding Cr, B or O to these layers, for example, CoCr/PtCr, CoB/PdB and CoO/RhO may be used.

The thickness of the perpendicular magnetic recording layer is preferably 5 to 60 nm and more preferably 10 to 40 nm. When the thickness is in this range, a magnetic recording apparatus suitable to higher recording density can be manufactured. If the thickness of the perpendicular magnetic recording layer is less than 5 nm, read outputs are too low and noise components tend to be higher. If the thickness of the perpendicular magnetic recording layer exceeds 40 nm, read outputs are too high and the waveform tends to be distorted. The coercivity of the perpendicular magnetic recording layer is preferably 237000 A/m (3000 Oe) or more. If the coercivity is less than 237000 A/m (3000 Oe), thermal fluctuation resistance tends to be degraded. The perpendicular squareness of the perpendicular magnetic recording layer is preferably 0.8 or more. If the perpendicular squareness is less than 0.8, the thermal fluctuation resistance tends to be degraded.

<Protective Film>

The protective film is provided for the purpose of preventing corrosion of the perpendicular magnetic recording layer and also preventing the surface of a medium from being damaged when the magnetic head is brought into contact with the medium. Examples of the material of the protective film include those containing C, $SiO_2$ or $ZrO_2$. It is preferable to set the thickness of the protective film from 1 to 10 nm. Since such a thin protective film enables to reduce the spacing between the head and medium, it is suitable for high-density recording. Carbon may be classified into $sp^2$-bonded carbon (graphite) and $sp^3$-bonded carbon (diamond). Though $sp^3$-bonded carbon is superior in durability and corrosion resistance to graphite, it is inferior in surface smoothness to graphite because it is crystalline material. Usually, carbon is deposited by sputtering using a graphite target. In this method, amorphous carbon in which $sp^2$-bonded carbon and $sp^3$-bonded carbon are mixed is formed. Carbon in which the ratio of $sp^3$-bonded carbon is larger is called diamond-like carbon (DLC). DLC is superior in durability and corrosion resistance and also in surface smoothness because it is amorphous and therefore utilized as the surface protective film for magnetic recording media. The deposition of DLC by chemical vapor deposition (CVD) produces DLC through excitation and decomposition of raw gas in plasma and chemical reactions, and therefore, DLC richer in $sp^3$-bonded carbon can be formed by adjusting the conditions.

Hereinafter, preferable conditions of manufacture for each step in the embodiments, other than the steps described above, will be described.

<Imprinting>

A resist is uniformly applied to the surface of a medium by spin-coating, dipping method, ink-jet method, or the like. As the resist, a general photosensitive resin, a thermoplastic resin or a thermosetting resin may be used. The resin may desirably be one which can be etched by RIE using a gas containing oxygen or fluorine.

As the stamper for imprinting, one which is made of a material such as quartz, resin, Si or Ni is used. When a stamper made of quartz or resin is used, it is preferable to use a photosensitive resin (photoresist) which is cured with ultraviolet rays. When the resist is made of a thermosetting resin or a thermoplastic resin, the stamper is preferably made of Si or Ni, in view of the heat or pressure applied thereto in imprinting.

The imprinting is performed, for example, by pressing the resist with a resin stamper on which patterns of recording tracks and servo information are formed with a pressure of 5 t for 60 seconds, and by irradiating the resist with ultraviolet ray for 10 seconds, to thereby transfer the patterns onto the resist. For the pressing, on the lower plate of a die set, laminated in order are: the stamper, the substrate, and the stamper. The resultant layers are sandwiched between the lower plate and the upper plate of the die set. The resist is applied on both sides of the substrate beforehand. The stamper and the substrate are disposed such that the surface of the stamper having the protrusions and recesses faces the resist-coated side of the substrate. The patterns of protrusions and recesses formed by the imprinting have a height of 40 to 50 nm, and resulting residues have a thickness of about 20 nm. If a fluorine-based peeling agent is applied to the stamper, the stamper can be peeled off from the resist satisfactorily.

<Removal of Residues>

Removal of resist residues left after the imprinting is performed by reactive ion etching (RIE). As the plasma source, inductively-coupled plasma (ICP) capable of producing high-density plasma under a low pressure is preferable, but an electron cyclotron resonance (ECR) plasma or general parallel-plate RIE system may be used. When a photosensitive resin is used as the resist, gaseous $O_2$, gaseous $CF_4$, or a mixed gas of $O_2$ and $CF_4$ is used. When an Si-based material (spin-on-glass [SOG], for example) is used as the resist, RIE which uses a gaseous fluorine compound such as $CF_4$ or $SF_6$ is used. The removal of residues is finished at the point where the second hard mask under the resist is exposed.

<Patterning of the Second Hard Mask>

After the steps of imprinting and the removal of the resist residues, the second hard mask is patterned on the basis of the patterns imprinted on the resist. RIE may be used for the patterning of the second hard mask, and also ion beam etching using Ar, Kr or Xe may be used. For example, in a case where the main component of the second hard mask is Al, Si, Ta or Ti, preferably used is a gaseous fluorine compound such as $CF_4$. In a case where the material of the second hard mask is Ag, Au, Co, Cr, Cu, Ni, Pd or Pt, an ion beam etching which uses a noble gas of Ar or the like may be used. The patterning of the second hard mask is finished at the point where the surface of the first hard mask is exposed.

<Patterning of the First Hard Mask>

Since the first hard mask contains carbon as a main raw material, the first hard mask has a low resistance to gaseous $O_2$ or $O_3$, and a high etching rate. Therefore, by forming the second hard mask having resistance to gaseous $O_2$ or $O_3$, it is possible to form a mask with a good rectangular shape. For the patterning of the first hard mask, RIE which uses a gas containing $O_2$ or $O_3$ is preferably used. In a case where the resist has a low resistance to gaseous $O_2$ or $O_3$, the resist remaining on the protrusions of the second hard mask may be stripped off simultaneously with the patterning of the first hard mask. The patterning of the first hard mask is finished at the point where the surface of the magnetic recording layer in the recesses is exposed.

<Removal of the Second Hard Mask>

Figure 5A:
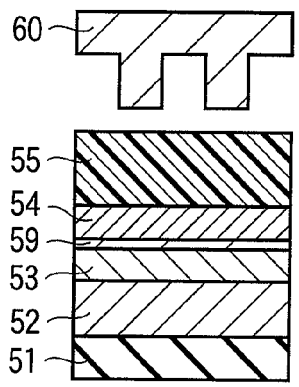
FIG. 5A, FIG. 5B, FIG. 5C, FIG. 5D, FIG. 5E, FIG. 5F, FIG. 5G, FIG. 5H, FIGS. 5I and 5J are sectional views showing another example of a method of manufacturing a magnetic recording medium according to an embodiment.
Figure 5B:
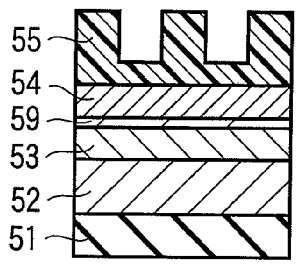
Figure 5C:
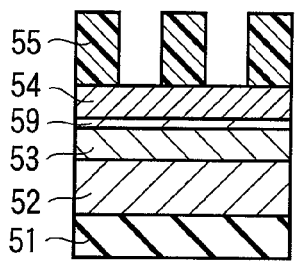
Figure 5D:
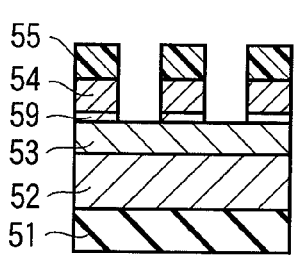
Figure 5E:
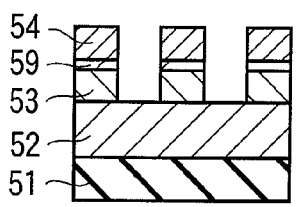
Figure 5F:
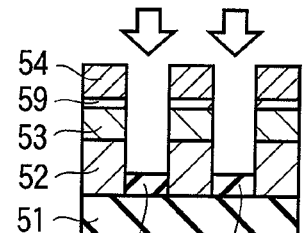
Figure 5G:
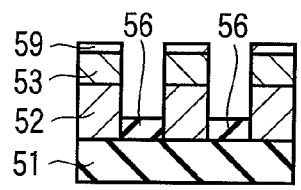

Removal of the second hard mask 54 is performed after the patterning of the first hard mask 53 (FIG. 3F or FIG. 4F), or after the patterning of the magnetic recording layer 52 (FIG. 5G). The removal is performed until the contaminating layer 59 is exposed. If the removal of the second hard mask 54 is omitted, the second hard mask 54 will react with the deactivating gas in the subsequent step of deactivation of the magnetism, and produce a re-deposition which is difficult to remove. Although it is possible to strip off the re-deposition in the last step of the process (immediately before DLC deposition), the stripping will need a long time, causing damage to the recording layer, and as a result, it will be difficult to obtain a final product usable as a magnetic recording medium.

The second hard mask 54 of the method of the embodiment may be removed by means of the RIE system as used in the patterning of the second hard mask 54, or by means of an ion beam etching which uses Ar, Kr, Xe and the like. For example, in a case where the material of the second hard mask 54 is Si, $SiO_2$, SixNy (wherein x:y=1:1 to 3:4), SiON, Al, Ta or Ti, preferably used is a gas containing fluorine, particularly $CF_4$. In a case where the material of the second hard mask 54 is Ag, Au, Co, Cr, Cu, Ni, Pd, Pt or Ru, an ion beam etching which uses a gas containing Ne, Ar, Kr or Xe, or a gas containing $O_2$ or $N_2$ may be used. Particularly, an ion beam etching which uses Ar is preferable.

<Removal of the First Hard Mask>

The first hard mask can be easily stripped off by means of oxygen asking, an ICP etching system, an RIE system or the like. It is not preferable to take too long a time for the stripping with respect to the thickness of the mask, because it would cause damage to the magnetic recording layer due to oxidation, and lower the S/N. For the purpose of preventing this problem, an antioxidant layer may be provided between the first hard mask and the magnetic recording layer.

<Step of Filling the Recesses>

After the mask is stripped off, filling of the recesses may be performed using a nonmagnetic material. The filling is performed by depositing a nonmagnetic material by means of bias sputtering or ordinal sputtering. The nonmagnetic material may be selected from inorganic substances, metals, and an oxide or a nitride thereof such as Si, SiC, SiC—C, SiOC, SiON, Si3N4, Al, AlxOy, Ti, TiOx, Ru, Pd, NiNb, NiNbTi, NiTa, NiSi, Zr, ZrOx, W, Ta, Cr, CrN and CN as a simple substance or mixture thereof. The bias sputtering is a sputter depositing method with the substrate being applied with a bias voltage. In this method, it is easy to deposit a film at the same time as filling the recesses.

In a case where the filling was performed, an etch-back is performed until the carbon protective film on the magnetic recording layer or the magnetic recording layer is exposed. This etch-back process is preferably performed by means of ion milling, but in a case where silicon-based filler such as $SiO_2$ is used, it is also possible to perform the process by means of RIE which uses a gaseous fluorine compound. Etching using an ECR ion gun may be performed. By mixing $O_2$ into a gas for the etch-back, etch-back can be performed at the same time as flattening the surface.

<Deposition of Protective Film and Post-Treatment>

The carbon protective film may be deposited to obtain good coverage over the protrusions and recesses preferably by means of CVD, but it may be deposited also by means of sputtering or vacuum deposition. When CVD is used, a DLC film containing a large amount of $sp^3$ bonded carbon is formed. Thickness of 2 nm or less is not preferable because it results in an unsatisfactory coverage. On the other hand, thickness of 10 nm or more is not preferable because it increases magnetic spacing between the read/write head and the medium to lower SNR. A lubricant is applied to the surface of the protective film. As the lubricant, for example, a perfluoropolyether, fluorinated alcohol, fluorinated carboxylic acid or the like may be used.

Now, the magnetic recording apparatus (HDD) will be described below. FIG. 6 is a perspective view of a magnetic recording apparatus in which the magnetic recording medium manufactured according to the embodiment is installed.

As shown in FIG. 6, the magnetic recording apparatus 150 according to the embodiment is of a type using a rotary actuator. The patterned medium 1 is attached to the spindle 140, and is rotated in the direction of arrow A by a motor (not shown) that responds to control signals from a drive controller (not shown). The magnetic recording apparatus 150 may comprise a plurality of patterned media 1.

The head slider 130 configured to read from and write to the patterned medium 1 is attached to the tip of the film-like suspension 154. The head slider 130 has a magnetic head mounted near the tip thereof. When the patterned medium 1 rotates, the air bearing surface (ABS) of the head slider 130 is held at a predetermined height so as to fly over the surface of the magnetic disk 200 under a balance of pressing force of the suspension 154 and the pressure produce on the air bearing surface (ABS) of head slider 130.

The suspension 154 is connected to one end of an actuator arm 155. A voice coil motor 156, a kind of linear motor, is provided on the other end of the actuator arm 155. The voice coil motor 156 is formed of a magnetic circuit including a driving coil (not shown) wound around a bobbin and a permanent magnet and a counter yoke arranged opposite to each other so as to sandwich the coil therebetween. The actuator arm 155 is held by ball bearings (not shown) provided at two vertical positions of the pivot 157. The actuator arm 155 can be rotatably slid by the voice coil motor 156. As a result, the magnetic head can be accessed any position on the patterned medium 1.

EXAMPLES

Example 1

A DTR medium was manufactured by the method as shown in FIGS. 3A-3J.

As shown in FIG. 3A, successively deposited on a glass substrate 51 were: a soft magnetic layer (CoZrNb) with a thickness of 40 nm, an underlayer for orientation control (Ru) with a thickness of 20 nm and a ferromagnetic recording layer (CoCrPt—SiO2) with a thickness of 20 nm as a magnetic recording layer; a carbon hard mask (C) with a thickness of 25 nm as a first hard mask 53; and Si with a thickness of 3 nm as a second hard mask 54. To the resultant layers, a photosensitive resin was applied by means of spin-coating to have a thickness of 50 nm as resist 55.

Secondly, as shown in FIG. 3B, imprinting was performed by means of a stamper 60 for imprinting on which the servo patterns and the patterns of the recording tracks as shown in FIG. 1 were formed.

Next, as shown in FIG. 3C, residues of the resist 55 remaining in the recesses was removed by means of an inductively coupled plasma (ICP) etching system which used $CF_4$ gas. The residues of the resist 55 were removed with a chamber pressure set to 0.1 Pa, an RF power of a coil and an RF power of a platen set to 100 W and 50 W, respectively, and an etching time set to 60 seconds, so that the surface of the second hard mask 54 was exposed in the recesses.

Then, as shown in FIG. 3D, the second hard mask 54 was etched so that the first hard mask 53 was exposed. This step was performed by means of an inductively coupled plasma (ICP) etching system which used gaseous $CF_4$ gas, with a chamber pressure set to 0.1 Pa, an RF power of a coil and an RF power of a platen set to 100 W and 50 W, respectively, and an etching time set to 10 seconds.

Then, as shown in FIG. 3E, the first hard mask 53 was etched to form the patterns. The first hard mask 53 composed of carbon was etched by means of an RIE system which used gaseous $O_2$, and under the conditions of gas pressure of 0.1 Pa, RF power of coil set to 100 W, RF power of a platen set to 50 W and processing time of 30 seconds. At the same time, the resist 55 remaining on the protrusions of the second hard mask 54 was removed.

Thereafter, as shown in FIG. 3F, the second hard mask (Si) 54 was removed. This step was performed by means of an inductively coupled plasma (ICP) etching system which used gaseous $CF_4$, with a chamber pressure set to 1.5 Pa, an RF power of a coil and an RF power of a platen set to 200 W and 0 W, respectively, and an etching time set to 60 seconds. By this step, the remaining second hard mask 54 was entirely removed.

Subsequently, as shown in FIG. 3G, the contaminating layer 59 left on the surface of the first hard mask 53 was removed. The step was performed by means of an RIE system which used a mixed gas of $CF_4$ and $O_2$ at a flow ratio of 1:15, with a chamber pressure set to 1.5 Pa, an RF power of a coil and an RF power of a platen set to 400 W and 0 W, respectively, and an etching time set to 15 seconds.

Then, as shown in FIG. 3H, deactivation of the magnetism was performed. To deactivate the magnetism of the recessed regions of the magnetic recording layer 52, the crystal structure was changed to amorphous phase by a deactivating gas. This step was performed with 200 seconds of exposure to the gas, using an ECR ion gun, with a gas pressure of 0.02 Pa, a microwave power of 1000 W, and an acceleration voltage of 1000 V. In the step, a mixed gas of He and $N_2$ was used at a flow ratio of 1:1.

Then, as shown in FIG. 3I, the first hard mask 53 was removed. This step was performed by means of an ICP etching system which used gaseous $O_2$, with a chamber pressure set to 1.5 Pa, an RF power of a coil set to 400 W, an RF power of a platen set to 0 W and a processing time set to 30 seconds.

As the last step, as shown in FIG. 3J, a protective film 57 was formed. By means of chemical vapor deposition (CVD), a carbon protective film was deposited on the surface. A lubricant was applied thereto to provide a DTR medium of the embodiment.

The DTR medium obtained by the steps above was mounted on a glide tester, to be subjected to a glide test by an acoustic emission (AE) method. As a result, the medium passed the test for a head flying height of 10 nm to show a very good property as a DTR medium.

Example 2

A DTR medium was manufactured according to the manufacturing method shown in FIGS. 4A to 4J. The method shown in FIGS. 4A to 4J is a variation of the method shown in FIGS. 3A to 3J in which the order of the steps of FIGS. 3G and 3H was changed. Therefore, the steps up to FIG. 4E of the present example are the same as the steps up to FIG. 3E of Example 1. The subsequent steps after FIG. 4F will be described below.

As shown in FIG. 4F, the second hard mask (Si) 54 was removed. The step was performed by means of an inductively coupled plasma (ICP) etching system which used gaseous $CF_4$, with a chamber pressure set to 1.5 Pa, an RF power of a coil and an RF power of a platen set to 200 W and 0 W, respectively, and an etching time set to 60 seconds. By this step, the remaining second hard mask 54 was entirely removed.

Figure 4G:
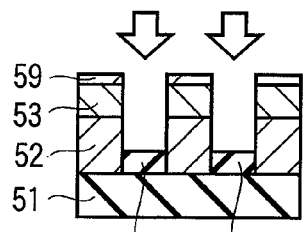
Figure 4C:
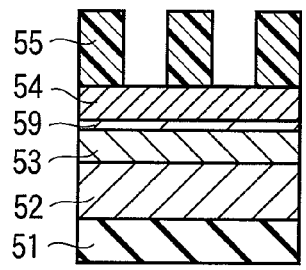
Figure 4H:
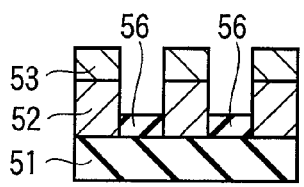
Figure 4D:
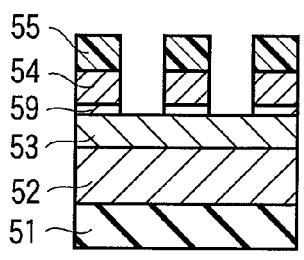
Figure 5H:
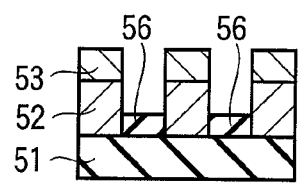

Then as shown in FIG. 4G, the deactivation of the magnetism was performed. To deactivate the magnetism of the recessed regions of the magnetic recording layer 52, the crystal structure was changed to amorphous phase by a deactivating gas. This step was performed with 250 seconds of exposure to the gas using an ECR ion gun, under the conditions of a gas pressure of 0.02 Pa, a microwave power of 1000 W, and an acceleration voltage of 1000 V. In the step, a mixed gas of He and $N_2$ was used at a flow ratio of 1:1.

Subsequently, as shown in FIG. 4H, the contaminating layer 59 left on the surface of the first hard mask 53 was removed. This step was performed by means of an RIE system which used a mixed gas of $CF_4$ and $O_2$ at a flow ratio of 1:15, with a chamber pressure set to 1.5 Pa, an RF power of a coil and an RF power of a platen set to 400 W and 0 W, respectively, and an etching time set to 10 seconds.

Figure 4I:
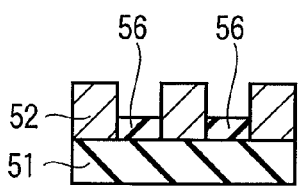
Figure 4E:
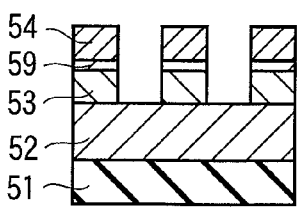

Then, as shown in FIG. 4I, the first hard mask 53 was removed. This step was performed by means of an ICP etching system which used gaseous $O_2$, under the conditions of a chamber pressure set to 1.5 Pa, an RF power of a coil set to 400 W, an RF power of a platen set to 0 W and a processing time set to 30 seconds.

Figure 4J:
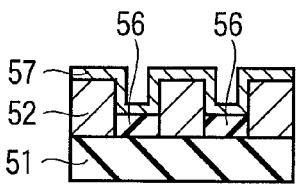

As the last step, as shown in FIG. 4J, a protective film 57 was formed. By means of chemical vapor deposition (CVD), a carbon protective film was deposited on the surface. A lubricant was applied thereto to provide a DTR medium of the embodiment.

The DTR medium obtained by the steps above was mounted on a glide tester, to be subjected to a glide test by an acoustic emission (AE) method. As a result, the medium passed the test for a head flying height of 10 nm to show a very good property as a DTR medium.

Example 3

A DTR medium was manufactured according to the manufacturing method shown in FIGS. 5A to 5J. The method shown in FIGS. 5A to 5J is a variation of the method shown in FIGS. 3A to 3J in which the order of the steps of FIGS. 3F to 3H was changed. Therefore, the steps up to FIG. 5E of the present example are the same as the steps up to FIG. 3E of Example 1. The subsequent steps after FIG. 5F will be described below.

Then, as shown in FIG. 5F, the deactivation of the magnetism was performed. To deactivate the magnetism of the recessed regions of the magnetic recording layer 52, the crystal structure was changed to amorphous phase by a deactivating gas. This step was performed with 250 seconds of exposure to the gas using an ECR ion gun, under the conditions of a gas pressure of 0.02 Pa, a microwave power of 1000 W, and an acceleration voltage of 1000 V. In the step, a mixed gas of He and $N_2$ was used at a flow ratio of 1:1.

As shown in FIG. 5G, the second hard mask (Si) 54 was removed. The step was performed by means of an inductively coupled plasma (ICP) etching system which used gaseous $CF_4$, with a chamber pressure set to 1.5 Pa, an RF power of a coil and an RF power of a platen set to 200 W and 0 W, respectively, and an etching time set to 30 seconds. By this step, the remaining second hard mask 54 was entirely removed.

Subsequently, as shown in FIG. 5H, the contaminating layer 59 left on the surface of the first hard mask 53 was removed. The step was performed by means of an RIE system which used a mixed gas of $CF_4$ and $O_2$ at a flow ratio of 1:15, with a chamber pressure set to 1.5 Pa, an RF power of a coil and an RF power of a platen set to 400 W and 0 W, respectively, and an etching time set to 15 seconds.

Figure 5I:
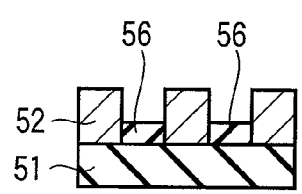

Then, as shown in FIG. 5I, the first hard mask 53 was removed. This step was performed by means of an ICP etching system which used gaseous $O_2$, under the conditions of a chamber pressure set to 1.5 Pa, an RF power of a coil set to 400 W, an RF power of a platen set to 0 W and a processing time set to 30 seconds.

Figure 5J:
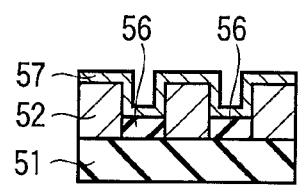

As the last step, as shown in FIG. 5J, a protective film 57 was formed. By means of chemical vapor deposition (CVD), a carbon protective film was deposited on the surface. A lubricant was applied thereto to provide a DTR medium of the embodiment.

The DTR medium obtained by the steps above was mounted on a glide tester, to be subjected to a glide test by an acoustic emission (AE) method. As a result, the medium passed the test for a head flying height of 10 nm to show a very good property as a DTR medium.

Example 4

A step of reducing the magnetic recording layer 52 was added to each of the methods of Examples 1 to 3 to thereby manufacture DTR media. Specifically, between the steps of FIGS. 3I and 3J, FIGS. 4I and 4J or FIGS. 5I and 5J, a step of reduction was performed by means of an RIE system which used hydrogen gas, with an RF power of a coil set to 200 W, an RF power of a platen set to 20 W and a processing time set to 20 seconds.

The thus obtained three kinds of DTR media were mounted on a glide tester, to be subjected to a glide test by an acoustic emission (AE) method. As a result, each medium passed the test for a head flying height of 9 nm to show a very good property as a DTR medium.

Example 5

DTR media were manufactured in the same manner as in Example 1 except that the flow ratio of $CF_4$ and $O_2$ in the mixed gas used in the removal of the contaminating layer 59 was changed. Specifically, the proportion of $CF_4$ was set to 0.5%, 10%, 50% or 90% to produce four kinds of DTR media.

The thus obtained four kinds of DTR media were mounted on a glide tester, to be subjected to a glide test by an acoustic emission (AE) method. As a result, each medium passed the test for a head flying height of 10 nm to show a very good property as a DTR medium.

Example 6

DTR media were manufactured in the same manner as in Example 1 except that the kind of fluorine compound in the mixed gas used in the removal of the contaminating layer 59 was changed. Specifically, $CF_4$, $C_2F_6$, $C_3F_8$, $C_4F_8$, $SF_6$, $NF_3$, $CHF_3$ or HF was used as the gaseous fluorine compound to produce eight kinds of DTR media.

The thus obtained eight kinds of DTR media were mounted on a glide tester, to be subjected to a glide test by an acoustic emission (AE) method. As a result, each medium passed the test for a head flying height of 10 nm to show a very good property as a DTR medium.

Example 7

A DTR medium was manufactured based on the manufacturing method of Example 1 except that the material for the second hard mask 54 was changed to Ag, Au, Co, Cr, Cu, Ni, Pd, Pt or Ru. Specifically, the step was performed as described below.

As shown in FIG. 3A, successively deposited on the glass substrate 51 were: a soft magnetic layer (CoZrNb) with a thickness of 40 nm, an underlayer for orientation control (Ru) with a thickness of 20 nm, a ferromagnetic recording layer (CoCrPt—$SiO_2$) with a thickness of 20 nm as a magnetic recording layer; a carbon hard mask (C) with a thickness of 25 nm as the first hard mask 53; any of Ag, Au, Co, Cr, Cu, Ni, Pd, Pt or Ru with a thickness of 3 nm as the second hard mask 54. To the resultant layers, a photosensitive resin was applied by means of spin-coating to have a thickness of 50 nm as the resist 55.

Subsequently, as shown in FIG. 3B, imprinting was performed by means of the stamper 60 for imprinting on which the servo patterns and the patterns of the recording tracks as shown in FIG. 1 or FIG. 2 were formed.

Then, as shown in FIG. 3C, residues of the resist 55 remaining in the recesses were removed by means of an inductively-coupled plasma (ICP) etching system which used gaseous $O_2$. The residues of the resist 55 were removed with a chamber pressure set to 0.1 Pa, an RF power of a coil and an RF power of a platen set to 100 W and 50 W, respectively, and an etching time set to 30 seconds, so that surface of the second hard mask 54 was exposed in the recesses.

Then, as shown in FIG. 3D, the second hard mask 54 was etched so that the first hard mask 53 was exposed. The etching was performed by means of an ECR ion gun which used Ar as a process gas, with a chamber pressure of 0.04 Pa, a microwave power of 600 W, an acceleration voltage of 300 V and processing time of 30 seconds.

Then, as shown in FIG. 3E, the first hard mask 53 was etched to form the patterns, using the patterned second hard mask 54 as a mask. The first hard mask 53 composed of carbon was etched by means of an RIE system which used gaseous $O_2$, under the conditions of gas pressure of 0.1 Pa, an RF power of a coil set to 100 W, an RF power of a platen set to 50 W and processing time of 30 seconds. At the same time, the resist 55 remaining on the protrusions of the second hard mask 54 was removed.

Thereafter, as shown in FIG. 3F, the second hard mask 54 was removed. The etching was performed by means of an ECR ion gun which used Ar as a process gas, with a chamber pressure of 0.04 Pa, a microwave power of 600 W, an acceleration voltage of 300 V and a processing time of 30 seconds. By this step, the remaining second hard mask 54 was entirely removed.

Subsequently, as shown in FIG. 3G, the contaminating layer 59 left on the surface of the first hard mask 53 was removed. The step was performed by means of an RIE system which used a mixed gas of $CF_4$ and $O_2$ (flow ratio of 1:15), with a chamber pressure set to 1.5 Pa, an RF power of a coil and an RF power of a platen set to 400 W and 0 W, respectively, and an etching time set to 15 seconds.

Then as shown in FIG. 3H, the deactivation of the magnetism was performed. By means of a deactivating gas, the crystal was changed to amorphous phase in order to eliminate the magnetism of the magnetic recording layer 52 in the recesses. This step was performed by means of an RIE system which used gaseous $CF_4$, with a gas pressure set to 1.5 Pa, an RF power of a coil and an RF power of a platen set to 400 W and 0 W, respectively, and a processing time set to 300 seconds.

Then, as shown in FIG. 3I, the first hard mask 53 (carbon) was removed. This step was performed by means of an ICP etching system which used gaseous $O_2$, under the conditions of chamber pressure set to 1.5 Pa, an RF power of a coil and an RF power of a platen set to 400 W and 0 W, respectively, and an etching time set to 30 seconds.

As the last step, as shown in FIG. 3J, a protective film was formed. By means of chemical vapor deposition (CVD), a carbon protective film was formed on the surface, and a lubricant was applied thereto to provide a medium of the embodiment.

The medium obtained by the steps above was mounted on a glide tester, to be subjected to a glide test by an acoustic emission (AE) method. As a result, the medium passed the test for a head flying height of 10 nm to show a very good property as a medium.

Example 8

A DTR medium was manufactured in the same manner as in Example 1 except that the material for the second hard mask 54 was changed to Si, $SiO_2$, SixNy (wherein x:y=1:1 to 3:4), SiON, SiC, Al, Ta or Ti.

The thus obtained DTR medium was mounted on a glide tester, to be subjected to a glide test by an acoustic emission (AE) method. As a result, the medium passed the test for a head flying height of 10 nm to show a very good property as a DTR medium.

Example 9

A DTR medium was manufactured in the same manner as in Example 1 except that the gas used for the deactivation of the magnetic recording layer 52 was changed to $H_2$, $O_2$, $N_2$, $CF_4$, $C_2F_6$, $C_3F_8$, $C_4F_8$, $SF_6$, $NF_3$, $CHF_3$, HF, CO, $NH_3$, $Cl_2$, He, Ar, Ne, Kr or Xe.

The thus obtained DTR medium was mounted on a glide tester, to be subjected to a glide test by an acoustic emission (AE) method. As a result, the medium passed the test for a head flying height of 10 nm to show a very good property as a DTR medium.

Example 10

A DTR medium was manufactured in the same manner as in Example 9 except that a step of partially etching the magnetic recording layer 52 by an irradiation of an ion beam was performed prior to the deactivation of the magnetism. Specifically, next to the removal of the contaminating layer 59 as shown in FIG. 3G, a step of etching which will be explained below was performed, and after finishing the etching, a step of deactivation as shown in FIG. 3H was performed.

The step of partially etching the magnetic recording layer 52 was performed with an ion beam which used a noble gas of He, Ne, Ar, Kr or Xe; or gaseous $H_2$, $O_2$, $N_2$, CO, $NH_3$ or $Cl_2$. The step was performed by means of an ECR ion gun, with a chamber pressure of 0.04 Pa, a microwave power of 600 W, an acceleration voltage of 300 V and a processing time of 10 to 60 seconds to leave protrusions and recesses of the magnetic recording layer with a thickness of 2, 5, 10 or 15 nm.

The thus obtained DTR medium was mounted on a glide tester, to be subjected to a glide test by an acoustic emission (AE) method. As a result, the medium passed the test for a head flying height of 10 nm to show a very good property as a DTR medium.

Example 11

A DTR medium was manufactured in the same manner as in Example 1 except that, as a means for patterning, the magnetic recording layer 52 was etched until the underlying layer disposed on the glass substrate 51 was exposed to thereby separate the magnetic recording layer 52, instead of performing the deactivation step (FIG. 3G). Specifically, the following steps were performed instead of the steps shown in FIG. 3H.

An ion beam which used a noble gas of He, Ne, Ar, Kr or Xe; or gaseous $H_2$, $O_2$, $N_2$, CO, $NH_3$ or $Cl_2$ was used in the step. By means of an ECR ion gun, etching was performed with a chamber pressure of 0.04 Pa, a microwave power of 600 W, an acceleration voltage of 300 V and a processing time of 80-300 seconds, and the regions which were not covered with the first hard mask 53 in the magnetic recording layer 52 were entirely removed. Thereafter, a filling step was performed by means of a bias sputtering method using $SiO_2$, and a flattening step was performed to provide an Ra of the medium of 1 nm or less.

The thus obtained DTR medium was mounted on a glide tester, to be subjected to a glide test by an acoustic emission (AE) method. As a result, the medium passed the test for a head flying height of 10 nm to show a very good property as a DTR medium.

Example 12

A patterned medium was manufactured in the same manner as in Example 1, except that a stamper having the dot pattern shown in FIG. 2 formed thereon was used as the stamper 60; and a CoPt alloy having a thickness of 20 nm was used as the magnetic recording layer 52.

The thus obtained patterned medium was mounted on a glide tester, to be subjected to a glide test by an acoustic emission (AE) method. As a result, the medium passed the test for a head flying height of 10 nm to show a very good property as a patterned medium.

Comparative Example 1

A DTR medium was manufactured in the same manner as in Example 1, except that the step corresponding to FIG. 3G was omitted. Specifically, the removal of the second hard mask 54 (FIG. 3F) was directly followed by the steps of deactivation of the magnetism (FIG. 3H) and removal of the first hard mask 53 (FIG. 3I), without performing the step of removing the contaminating layer 59 by the mixed gas of $CF_4$ and $O_2$.

The thus obtained DTR medium was mounted on a glide tester, to be subjected to a glide test by an acoustic emission (AE) method. As a result, the medium did not pass the test for a head flying height of 10 nm and 12 nm showing a problem in the glide property as a DTR medium. In addition, when the surface of the produced DTR medium was inspected by an AFM measurement, projections having a height of about 3 nm were observed on the protrusions. This is considered to be the remaining contaminating layer 59 which was not removed by the method.

Comparative Example 2

A DTR medium was manufactured in the same manner as in Example 1, except that the step corresponding to FIG. 3G was omitted as in Comparative Example 1; and that in the step of removing the second hard mask 53 corresponding to FIG. 3I, the time for etching which used gaseous $O_2$ was suitably extended. When the time for etching was set to 150 seconds, peeling of the contaminating layer was observed.

The DTR medium obtained by the method in which the time for the etching was set to 150 seconds was mounted on a glide tester, to be subjected to a glide test by an acoustic emission (AE) method. As a result, the medium passed the test for a head flying height of 10 nm to show a glide property acceptable for a DTR medium. However, in the subsequent evaluation of signal intensity using spin-stand, it was found that the signal intensity was reduced to a half thereof, which indicated an oxidative damage imparted to the magnetic material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetic recording medium, comprising:
    forming a first hard mask comprising carbon as a main component, a second hard mask comprising a material selected from the group comprising silver (Ag), gold (Au), cobalt (Co), chromium (Cr), copper (Cu), nickel (Ni), palladium (Pd), platinum (Pt), ruthenium (Ru), an alloy thereof, silicon (Si), silicon dioxide ($SiO_2$), silicon nitride (SixNy, wherein a ratio of x/y ranges from 1/1 to 3/4), silicon oxynitride (SiON), silicon carbide (SiC), aluminum (Al), tantalum (Ta), and titanium (Ti) as a main component and a resist on a magnetic recording layer;
    imprinting the resist with a stamper to transfer patterns of protrusions and recesses to the resist;
    removing residues in the recesses of the patterned resist;
    etching the second hard mask by using the patterned resist as a mask to transfer the patterns of protrusions and recesses to the second hard mask;
    etching the first hard mask by using the second hard mask as a mask to transfer the patterns of protrusions and recesses to the first hard mask;
    patterning the magnetic recording layer; and
    removing the first hard mask,
    wherein the method comprises removing the second hard mask remaining on the protrusions of the first hard mask, and removing a mixing layer on a surface of the first hard mask by etching using a mixed gas of oxygen-based gas and a gaseous fluorine compound, between etching the first hard mask to transfer the patterns of protrusions and recesses to the first hard mask and removing the first hard mask.

2. The method of claim 1, comprising removing the second hard mask remaining on the protrusions of the first hard mask, removing the mixing layer on the surface of the first hard mask by etching using a mixed gas of oxygen-based gas and a gaseous fluorine compound, patterning the magnetic recording layer, and removing the first hard mask, after etching the first hard mask to transfer the patterns of protrusions and recesses to the first hard mask.

3. The method of claim 1, comprising removing the second hard mask remaining on the protrusions of the first hard mask, patterning the magnetic recording layer, removing the mixing layer on the surface of the first hard mask by etching using a mixed gas of oxygen-based gas and a gaseous fluorine compound, and removing the first hard mask, after etching the first hard mask to transfer the patterns of protrusions and recesses to the first hard mask.

4. The method of claim 1, comprising patterning the magnetic recording layer, removing the second hard mask remaining on the protrusions of the first hard mask, removing the mixing layer on the surface of the first hard mask by etching using a mixed gas of oxygen-based gas and a gaseous fluorine compound, and removing the first hard mask, after etching the first hard mask to transfer the patterns of protrusions and recesses to the first hard mask.

5. The method of claim 1, further comprising reducing the magnetic recording layer by exposure to a reducing gas, after removing the first hard mask.

6. The method of claim 1, wherein a partial pressure of the gaseous fluorine compound in the mixed gas is 0.5% or more and 90% or less.

7. The method of claim 1, wherein the gaseous fluorine compound is selected from the group comprising tetrafluoromethane ($CF_4$), hexafluoroethane ($C_2F_6$), octafluoropropane ($C_3F_8$), octafluorocyclobutane ($C_4F_8$), sulfur hexafluoride ($SF_6$), nitrogen trifluoride ($NF_3$), trifluoromethane ($CHF_3$), hydrogen fluoride(HF) and a mixture thereof.

8. The method of claim 1, wherein the patterning of the magnetic recording layer is performed by completely separating the magnetic recording layer by etching using a gas selected from the group comprising a noble gas of helium (He), argon (Ar), neon (Ne), krypton (Kr) and xenon (Xe), and gaseous oxygen ($O_2$), nitrogen ($N_2$), chlorine ($Cl_2$), tetrafluoromethane ($CF_4$), ammonia ($NH_3$) and carbon monoxide (CO).

9. The method of claim 1, wherein removing residues in the recesses of the patterned resist and etching the second hard mask by using the patterned resist as a mask are performed at a time.

10. The method of claim 1, wherein the proportion of carbon in the first hard mask is more than 75% in terms of atom number ratio.

11. The method of claim 1, wherein the thickness of the first hard mask is 4 to 50 nm.

12. The method of claim 1, wherein the thickness of the second hard mask is 1 to 15 nm.

13. The method of claim 1, wherein the oxygen-based gas and the gaseous fluorine compound in the mixed gas are $O_2$ and $CF_4$, respectively.

14. The method of claim 1, wherein patterning the magnetic recording layer is performed by irradiation of an ion beam of a mixed bas of $N_2$ and He.

15. The method of claim 1, wherein the patterning of the magnetic recording layer is performed by deactivation using a deactivating gas.

16. The method of claim 15, wherein the deactivation is performed by irradiation of an ion beam of a gas selected from the group comprising hydrogen ($H_2$), oxygen ($O_2$), ozone ($O_3$), nitrogen ($N_2$), tetrafluoromethane ($CF_4$), hexafluoroethane ($C_2F_6$), octafluoropropane ($C_3F_8$), octafluorocyclobutane ($C_4F_8$), sulfur hexafluoride ($SF_6$), nitrogen trifluoride ($NF_3$), trifluoromethane ($CHF_3$), hydrogen fluoride(HF), carbon monoxide (CO), ammonia($NH_3$), chlorine ($Cl_2$), helium (He), argon (Ar), neon (Ne), krypton (Kr), xenon (Xe) and a mixture thereof.

17. The method of claim 16, further comprising, prior to the deactivation, etching the magnetic recording layer to a depth of 15 nm or less using a gas selected from the group comprising a noble gas of helium (He), argon (Ar), neon (Ne), krypton (Kr) and xenon (Xe), and gaseous oxygen ($O_2$), nitrogen ($N_2$), chlorine ($Cl_2$), tetrafluoromethane ($CF_4$), ammonia ($NH_3$) and carbon monoxide (CO) to provide a difference from protrusions.

* * * * *